United States Patent [19]

Shimizu et al.

[11] Patent Number: 5,347,151
[45] Date of Patent: Sep. 13, 1994

[54] DRAM WITH MEMORY CELLS HAVING ACCESS TRANSISTOR FORMED ON SOLID PHASE EPITAXIAL SINGLE CRYSTALLINE LAYER AND MANUFACTURING METHOD THEREOF

[75] Inventors: Masahiro Shimizu; Takehisa Yamaguchi; Natsuo Ajika, all of Hyogo, Japan

[73] Assignee: Mitsubishi Denki Kabushiki Kaisha, Tokyo, Japan

[21] Appl. No.: 797,888

[22] Filed: Nov. 26, 1991

[30] Foreign Application Priority Data

Dec. 6, 1990 [JP] Japan .................. 2-400683

[51] Int. Cl.⁵ ............... H01L 29/78; H01L 23/00
[52] U.S. Cl. .................... 257/296; 257/347
[58] Field of Search .......... 257/296, 347, 347, 75

[56] References Cited

U.S. PATENT DOCUMENTS

| 5,138,412 | 8/1992 | Hieda et al. | 257/296 |
| 5,196,910 | 3/1993 | Moriuzki et al. | 257/296 |

FOREIGN PATENT DOCUMENTS

| 54-159185 | 12/1979 | Japan | 257/347 |
| 55-61060 | 5/1980 | Japan | 257/296 |
| 60-2784 | 1/1985 | Japan | |
| 60-53082 | 3/1985 | Japan | 257/347 |
| 61-42949 | 3/1986 | Japan | 257/296 |
| 62-140455 | 6/1987 | Japan | 257/296 |
| 63-44755 | 2/1988 | Japan | 257/296 |

OTHER PUBLICATIONS

A. Möschwitzer, Halbleiterelektronik, 7th ed., Dr. A. Hüthing Verlag Heidelberg, 1987, pp. 341-342.

Shin'Ichiro Kimura et al., "A Diagonal Active-Area Stacked Capacitor DRAM Cell with Storage Capacitor on Bit Line", IEEE Transactions on Electron Devices, vol. 37, Nr. 3, Mar. 1990, 737-743.

Primary Examiner—Jerome Jackson
Assistant Examiner—Stephen D. Meier
Attorney, Agent, or Firm—Lowe, Price, LeBlanc & Becker

[57] ABSTRACT

Access transistors of memory cells in a DRAM are formed in a solid phrase epitaxial single crystalline layer on the surface of a silicon substrate. A bit line extending over the surface of an element isolation and insulation film is formed by patterning a polycrystalline silicon layer extending to the single crystalline silicon layer as a layer. A stacked capacitor is connected to one source/drain of the access transistor through a conductive layer extending to the single crystalline silicon layer and over a field oxide film. Part of the stacked capacitor extends over the bit line. The connection region of the bit line, the capacitor and the source/drain is formed above the element isolation and insulation film, so that the source/drain region of the access transistor can be reduced.

7 Claims, 8 Drawing Sheets

DRAM WITH MEMORY CELLS HAVING ACCESS TRANSISTOR FORMED ON SOLID PHASE EPITAXIAL SINGLE CRYSTALLINE LAYER AND MANUFACTURING METHOD THEREOF

BACKGROUND OF THE INVENTION

1. Field of the Invention

The invention relates to improvement of miniaturized structures of memory cells and bit line structures in DRAMs (Dynamic Random Access Memory) and a manufacturing method thereof.

2. Description of the Background Art

In recent years, the demand for semiconductor memory devices has been rapidly expanding due to the remarkable spread of information equipment such as a computer. Furthermore, in a functional aspect, there is a need for a semiconductor memory device having a large storage capacity and capable of operating at high speed. Accordingly, there has been developed the technique of increased integration density and fast response or high reliability of a semiconductor memory device.

Semiconductor memory devices comprise a DRAM capable of randomly inputting/outputting storage information. Generally, a DRAM is structured by a memory cell array which is a storage region for storing a large amount of storage information and peripheral circuits required for input/output with an external device.

Figure 15:
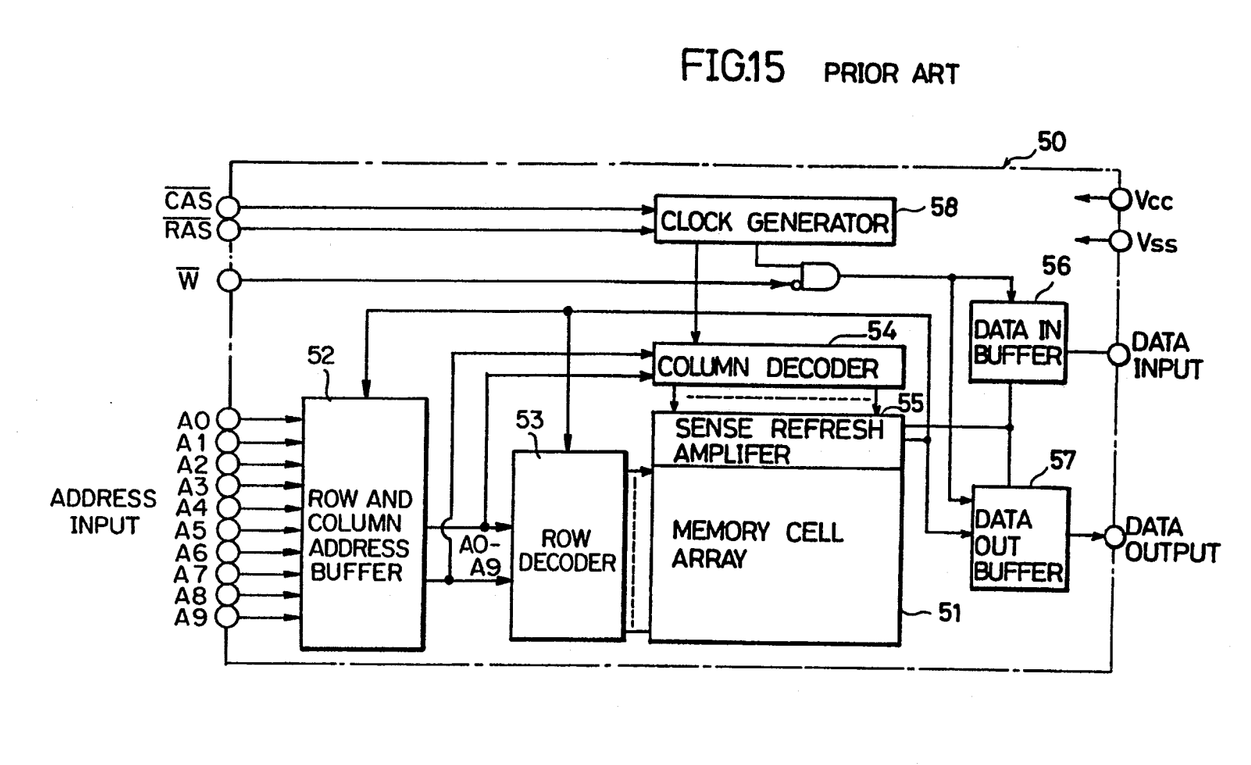
FIG. 15 is a block diagram showing the structure of a general DRAM.

FIG. 15 is a block diagram showing a structure of a conventional general DRAM. In FIG. 15, a DRAM 50 includes a memory cell array 51 for storing a data signal of storage information, a row and column address buffer 52 for receiving an externally applied address signal for selecting a memory cell constituting a unit storage circuit, a row decoder 53 and a column decoder 54 for designating a memory cell by decoding the address signal, a sense refresh amplifier 55 for amplifying and reading out a signal stored in the designated memory cell, a data in buffer 56 and a data out buffer 57 for data input/output and a clock generator 58 for generating a clock signal.

The memory cell array 51 occupying a large area on the semiconductor chip is formed by a plurality of memory cells arranged in a matrix for storing unit storage information.

Figure 16:
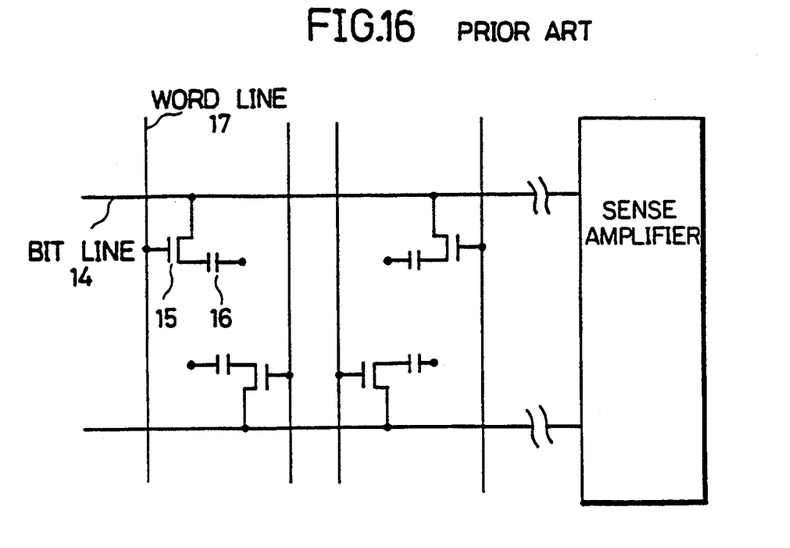
FIG. 16 is an equivalent circuit diagram of memory cells.

FIG. 16 is an equivalent circuit diagram of 4 memory cells included in the memory cell array 51. The illustrated memory cells are so-called single-transistor single-capacitor-type memory cells each structured by one MOS (Metal-Oxide-Semiconductor) transistor 15 and one capacitor 16 connected thereto. As the structure of this type of memory cell is simple, it is easy to enhance integration density of a memory cell array, so that it is widely used for a DRAM with a large storage capacity.

Memory cells of DRAMs can be divided into several types according to the structure of the capacitor for storing electric charge for information. A so-called stacked type memory cell is disclosed, for example, in Japanese Patent Publication No. 60-2784.

Figure 17:
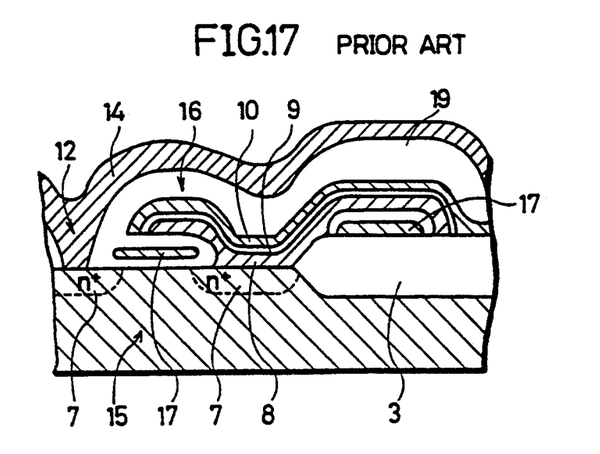
FIG. 17 is a cross sectional view of the structure of a memory cell in a conventional DRAM.

FIG. 17 is a sectional view of a structure of a stacked type memory cell stated in the article. As shown in FIG. 16, the memory cell includes one MOS transistor 15 and one capacitor 16. The MOS transistor 15 includes one pair of n+ impurity regions 7 and a gate electrode 17 constituted by part of a word line 17. The capacitor 16 has a layered structure of a lower electrode 8, a dielectric layer 9, and an upper electrode 10. The lower electrode 8 of the capacitor 16 is connected to one of the n+ impurity regions 7 of the MOS transistor 15. The capacitor 16 has its one end extending over the gate electrode 17 of the MOS transistor 15 and the other end extending over a field oxide film 3. It is intended to increase the electric charge storage capacity by forming the capacitor 16 in such a stepped configuration to increase the opposing area between the lower electrode 8 and the upper electrode 10. A bit line 14 is connected to the other n+ impurity region 7 of the MOS transistor 15. The bit line 14 is placed over the capacitor 16 with an interlayer insulating film 19 interposed therebetween. The bit line 14 is connected to the n+ impurity region 7 through a contact hole 12 formed in the interlayer insulating film 19.

However, an increased storage capacity in a DRAM has been needed more strongly, and correspondingly, miniaturization of an element structure of memory cells is required. The element structure of the MOS transistor 15 is further miniaturized with the need for miniaturization of the memory cell structure. One way for miniaturizing the MOS transistor 15 is to shorten the gate length and another way is to reduce the width of the impurity regions 7. In a stacked type memory cell as stated above, however, the lower electrode 8 of the capacitor 16 is directly in contact with one of the impurity regions 7 of the MOS transistor 15. Therefore, if the width of the impurity region 7 is reduced, the contact area between the lower electrode 8 of the capacitor 16 and the impurity region 7 is reduced, resulting in increase of the contact resistance. Accordingly, the width of the impurity regions 7 is controlled by the contact characteristic with the lower electrode 8 of the capacitor 16. A problem of an soft error arises, if the width of the impurity region 7 is large. A soft error is a phenomenon in which when α rays enter the silicon substrate, a malfunction of the device is caused. That is, when the α rays enter the silicon substrate, pairs of electrons and holes are generated. Then, the generated electrons enter the n-type impurity region 7 and are caught within the capacitor 16. If such a phenomenon is caused when there is no electron within the capacitor 16, it changes from a state without electrons to a state with electrons and inversion of information is caused, so that erroneous information is read out from the memory cells. Such an occurrence of a soft error is in proportion to the surface area of the n-type impurity regions 7, 7.

The bit line 14 is connected to the other impurity region 7 of the MOS transistor 15 through the contact hole 12. The contact hole 12 formed in the interlayer insulating layer 19 is formed by using photolithography involving mask alignment and an etching method. Therefore, the width of the impurity region 7 connected to this bit line 14 needs to be formed wide enough to absorb a mask alignment error at the time of forming the contact hole 12.

As stated above, in the conventional memory cell structure, it is difficult to reduce the width of the one pair of impurity regions 7, 7 of the MOS transistor 15.

Additionally, the bit line 14 is formed in such a largely stepped portion that it extends above the capacitor 16 and the contact portion thereof reaches a position of the substrate surface. Therefore, it is not preferable that a bit line with a miniaturized line width is formed in such a largely stepped region because coverage of bit line material becomes insufficient and accuracy of patterning the bit line material is decreased.

SUMMARY OF THE INVENTION

An object of the present invention is to miniaturize the structure of memory cells in a DRAM.

Another object of the present invention is to expand a capacitor forming region of a memory cell in a DRAM.

Still another object of the present invention is to reduce source/drain regions of an access transistor of a memory cell in a DRAM.

Still another object of the present invention is to control the occurrence of a soft error in a memory cell of a DRAM.

Yet another object of the present invention is to provide a method of manufacturing memory cells in a DRAM having a miniaturized structure.

In a first aspect of the present invention, a DRAM has an isolation region formed on the main surface of a silicon substrate of a first conductivity type and a single crystalline silicon layer formed on the main surface of the silicon substrate. An access transistor is formed on the surface of this single crystalline silicon layer, constituting a memory cell. The access transistor includes one pair of impurity regions of a second conductivity type formed on the surface of the single crystalline silicon layer with an interval therebetween, and a gate electrode formed over a gate insulating film and connected to part of a word line. A first electrode layer of a capacitor is connected to one of the impurity regions of the second conductivity type of the access transistor. A dielectric layer is formed on the surface of the first electrode layer and a second electrode layer is formed on the surface of the dielectric layer. The bit line extends in a predetermined direction, in contact with the surface of the isolation region, and has a polycrystalline silicon layer extending to the single crystalline silicon layer where the other impurity region of the second conductivity type of the access transistor is formed, and extending over the isolation region.

In the above-described DRAM, the single crystalline silicon layer to be formed on the surface of the silicon substrate and the bit line to be formed on the surface of the isolation region are formed by a common continuous layer. Therefore, it is possible to omit the process for forming a contact between the impurity region to be formed in the single crystalline silicon layer and the bit line and to reduce the width of the impurity region. Additionally, the bit line is formed near the surface of the substrate, so that it is possible to prevent the formation of a region having a large difference in level.

In a second aspect of the present invention, a DRAM further includes a conductive layer having a polycrystalline silicon layer extending to a single crystalline silicon layer, where one of impurity regions of a second conductivity type of an access transistor is formed, and over an element isolation and insulation film. A first electrode layer of a capacitor is connected to the surface of this conductive layer and a dielectric layer and a second electrode layer are formed on the surface of the first electrode layer. A bit line is connected to the other impurity region of the second conductivity type of the access transistor.

In a third aspect of the present invention, a method of manufacturing a DRAM includes the steps of: firstly forming an element isolation and insulation film in a predetermined region of the main surface of a silicon substrate; forming a single crystalline silicon layer on the main surface of the silicon substrate and forming a conductive layer extending to the single crystalline silicon layer on the surface of the element isolation and insulation film; forming a bit line over the element isolation and insulation film, extending in a predetermined direction by patterning the conductive layer; forming a gate insulating film and a gate electrode on the surface of the single crystalline silicon layer; implanting impurities in the single crystalline silicon layer using the gate electrode as a mask to form one pair of impurity regions; forming a first electrode layer so that part of the same is connected to the surface of the conductive layer extending over the element isolation and insulation film; and forming a dielectric layer and a second electrode layer on the surface of the first electrode layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
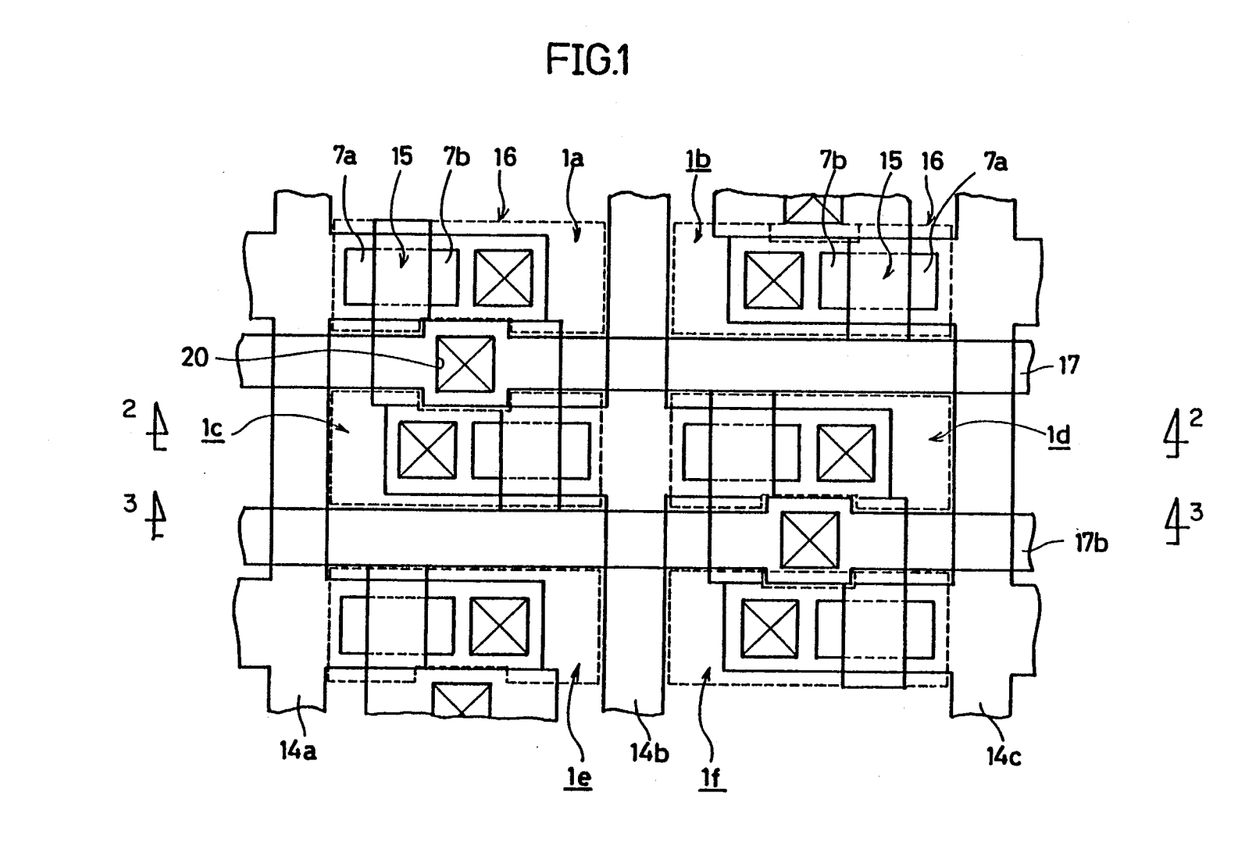
FIG. 1 is a plan view of the structure of memory cells in a DRAM according to an embodiment of the present invention.
Figure 2:
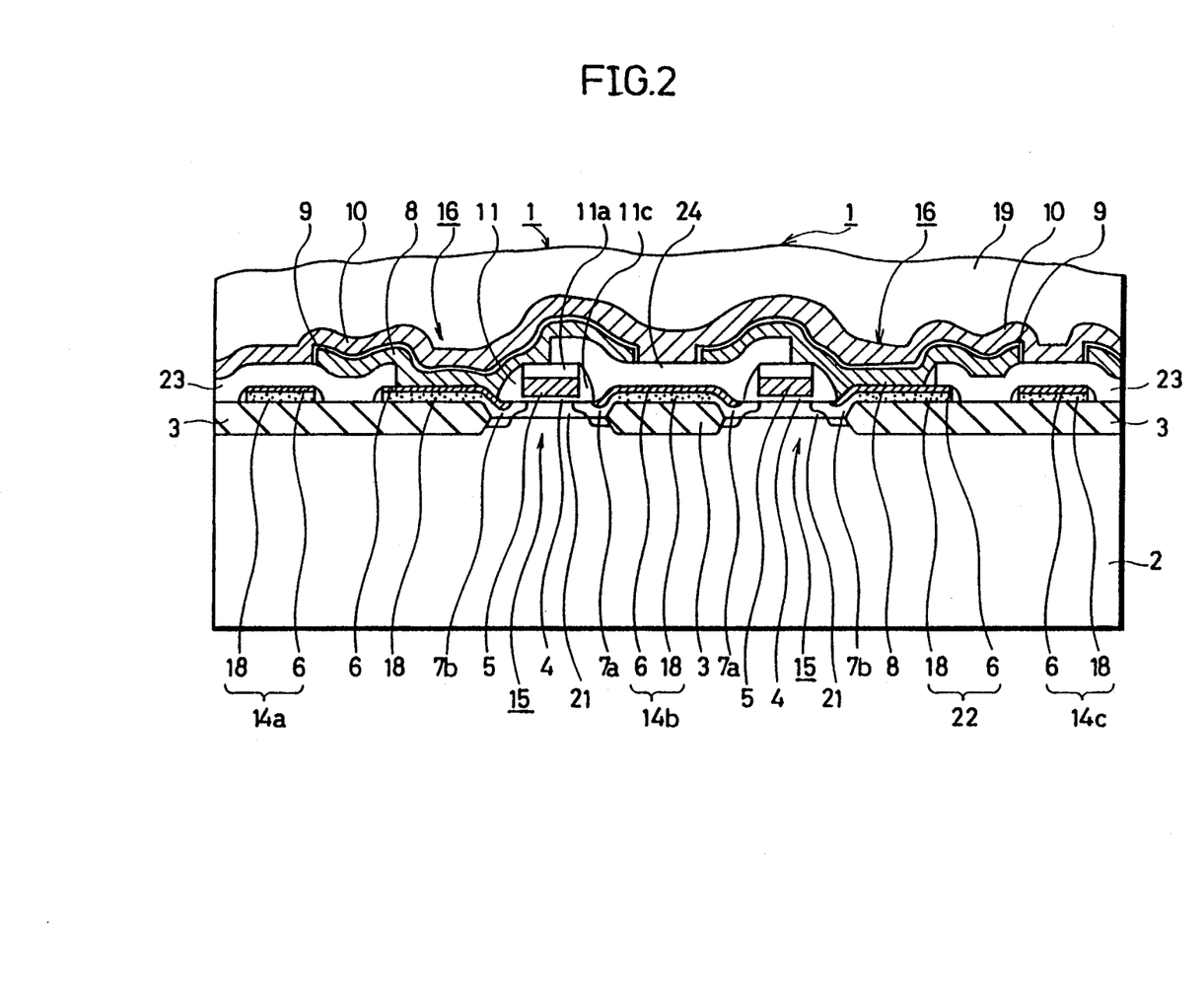
FIG. 2 is a cross sectional view of the structure of the memory cells shown in FIG. 1 from the direction along a cutting-plane line A—A.
Figure 3:
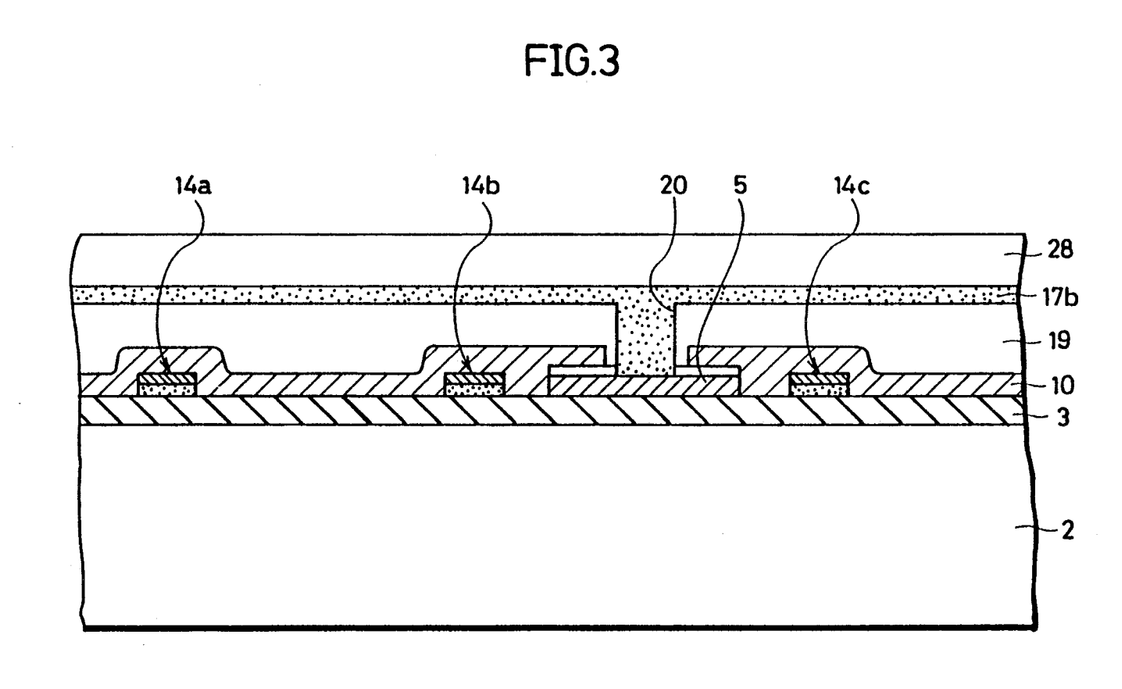
FIG. 3 is a cross sectional view of the structure of the memory cells shown in FIG. 1 taken from the direction along a cutting-plane line B—B.

FIG. 1 shows memory cells corresponding to 6 bits. Referring to FIGS. 1-3, there are formed a plurality of bit lines 14a, 14b, 14c extending parallel to each other and word lines 17a, 17b extending parallel to each other in the direction perpendicular to the bit lines 14a, 14b, 14c. The bit lines 14a, 14b, 14c have a double layered structure of a polycrystalline silicon layer 18 extending in a predetermined direction in contact with the surface of a field oxide film 3 and a titanium silicide layer 6 formed on the surface of the polycrystalline silicon layer. The word lines 17a, 17b are formed above a silicon substrate 2 with an interlayer insulating layer 19 interposed therebetween. They are connected to a gate electrode 5 of an access transistor 15 through a contact portion 20. As stated above, the bit lines 14a, 14b, 14c are arranged below the word lines 17a, 17b.

In the plan view, memory cells 1a, 1b, 1c, 1d, 1e, 1f are arranged in the regions surrounded by the word lines 17a, 17b and the bit lines 14a, 14b, 14c.

The field oxide film 3 is formed on the main surface of the silicon substrate 2, as surrounding element forming regions where access transistors 15 of the memory cells 1a to 1f are mainly formed. The field oxide film 3 insulates adjacent memory cells 1a to 1f from each other. However, in FIG. 1, the field oxide film 3 located between the memory cells 1c and 1d is not the one required for insulating the memory cell 1c and the memory cell 1d. This region of the field oxide film 3 is provided for forming the bit line 14b at the low position in the vicinity of the surface of the substrate. A single crystalline silicon layer 21 is formed on the surface of the silicon substrate 2 surrounded by the field oxide film 3 by a solid phase epitaxial growth method. The single crystalline silicon layer 21 extends to a polycrystalline silicon layer 18 extending over the field oxide film 3 adjacent to the single crystalline silicon layer 21, layer 21, forming a continuous layer.

Each of the memory cells 1a to 1f is constituted by one access transistor 15 and one capacitor 16. The access transistor 15 includes a pair of n-type impurity regions 7a, 7b to be a source/drain formed on the surface of the single crystalline silicon layer 21 and a gate electrode 5 formed over a gate insulating film 4. Each of the n-type impurity regions 7a, 7b has a so-called LDD (Lightly Doped Drain) structure including an impurity region of a relatively low concentration and an impurity region of a high concentration. As stated above, the gate electrode 5 is connected to the word lines 17a, 17b through the contact portion 20. This gate electrode 5 is formed by gate electrodes of access transistors 15, 15 of two adjacent memory cells. The word lines 17a, 17b are in contact with the gate electrodes 5, 5 of the two access transistors 15, 15 through a contact portion 20. The upper and side surfaces of the gate electrode 5 are covered with insulating films 11a, 11b, 11c. The sidewall insulating films 11b, 11c are formed on the sidewalls of the gate electrode 5, having different thicknesses. That is, the sidewall insulating film 11b on the side of the capacitor 16 is formed thicker than the other sidewall insulating film 11c.

The capacitor 16 is structured by forming a dielectric layer 9 including dielectric material such as a nitride film, an oxide film or a composite film of them between a lower electrode 8 and an upper electrode 10 including conductive material such as polycrystalline silicon. The lower electrode 8 of the capacitor 16 is connected to a conductive layer 22 for capacitor connection having a double layer structure of the polycrystalline silicon layer 18 and the titanium silicide layer 6 above the field oxide film 3. This conductive layer 22 is a continuous layer extending to the single crystalline silicon layer 21. The capacitor 16 has one end extending over the field oxide film 3 with a first insulating layer 23 interposed therebetween and the other end passing over the gate electrode 5 and extending over the bit lines 14a to 14c with a second insulating layer 24 interposed therebetween.

An effect as stated below can be obtained with use of a memory cell structure described above.

The bit lines 14a to 14c continuously extend to the n-type impurity region 7a of the access transistor 15 as a layer, so that their contact region can be reduced.

Formation of the bit lines 14a to 14c in contact with the surface of the field oxide film 3 makes it easier to form the bit lines, while eliminating a largely stepped portion.

Furthermore, the lower electrode 8 of the capacitor 16 continuously extends to the n-type impurity region 7b of the access transistor 15 as a layer, so that their contact region can be reduced in the similar way as in the case of the bit lines. Moreover, since the lower electrode 8 of the capacitor 16 and the n-type impurity region 7b are connected to each other over the field oxide film 3 with the conductive layer 22 extending on the upper surface of the field oxide film 3 interposed therebetween, their contact position or contact area can be more freely set compared with the conventional one.

The bit lines 14a to 14c are arranged below the capacitor 16, so-that the capacitor 16 can be extended over the bit lines, therefore making it possible to increase the electric charge storage capacity of the capacitor 16.

Furthermore, reduction of the width of the n-type impurity regions 7a, 7b of the access transistor 15 enables to enhance immunity to a soft error.

A manufacturing method of the memory cells shown in FIGS. 1 to 3 will now be described with reference to FIGS. 4 to 13.

Figure 4:
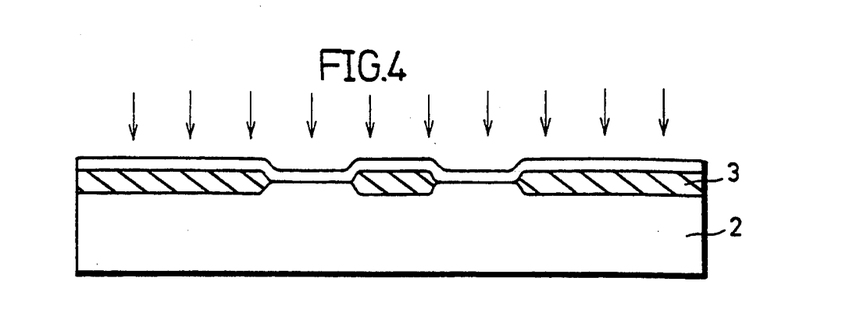
FIGS. 4–13 are cross sectional views of the structure of the memory cell shown in FIG. 2 in manufacturing processes.

Firstly, referring to FIG. 4, the thick field oxide film 3 is formed on the surface of the semiconductor substrate 2 using a LOCOS (Local Oxidation of Silicon) method. Then, the polycrystalline silicon layer 18 having a thickness of the order of 1500 Å is formed using, for example, a low pressure CVD (Chemical Vapor Deposition) method. Subsequently, silicon (Si) or germanium (Ge) ions 30 are implanted under the conditions of the implantation energy 100 keV and the dose $1 \times 10^{16}/cm^2$ using an ion implantation method to change the polycrystalline silicon layer 18 to be amorphous.

Figure 5:
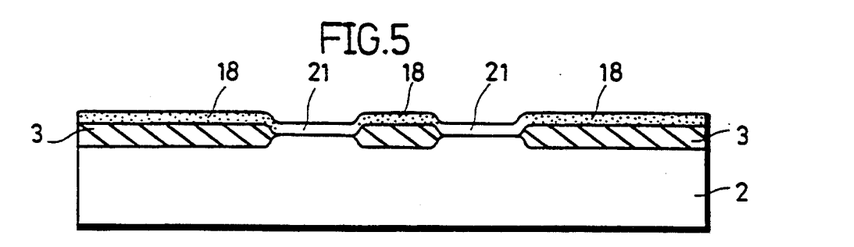

Referring now to FIG. 5, a heat treatment is applied, for example, at a temperature of 550° C. for two hours, and additionally at 800° C. for three hours within a furnace in an atmosphere of nitrogen. As a result of these heat treatment processes, the amorphous region in contact with the surface of the silicon substrate 2 becomes a single crystalline silicon layer 21 by the solid phase epitaxial growth and the amorphous silicon layer on the field oxide film 3 becomes the polycrystalline silicon layer 18.

Figure 6:
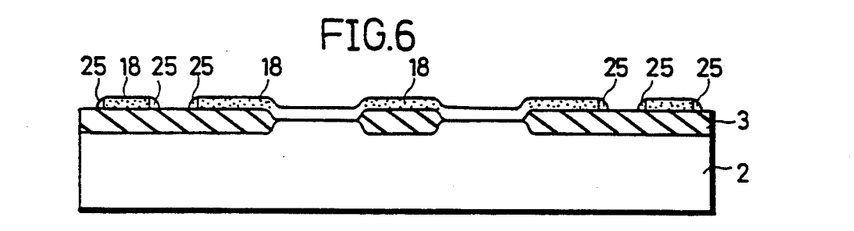

Furthermore, referring to FIG. 6, the single crystalline silicon layer 21 and the polycrystalline silicon layer 18 are patterned to a predetermined configuration using a photolithography method and an etching method. In this process, there are formed the polycrystalline silicon layer 18 of the bit lines 14a to 14c and the polycrystalline silicon layer 18 to be the conductive layer 22 connected to the capacitor 16. Furthermore, an insulating film such as an oxide film or a nitride film is deposited using, for example, a low pressure CVD method and then this insulating film is removed using anisotropic etching, so sidewalls 25 of the insulating film are formed on the sidewalls of the polycrystalline silicon layer 18.

Figure 7:
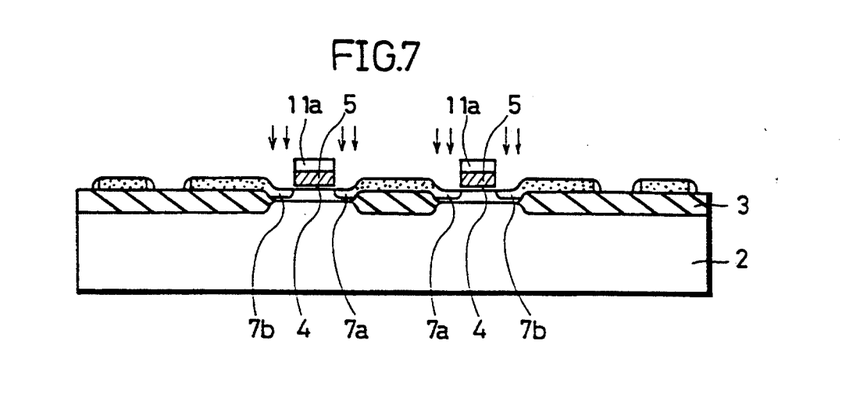

Referring to FIG. 7, the gate insulating film 4 including, for example, an oxide film and so on is formed on the surface of the single crystalline silicon layer 21 using a thermal oxidation method or the low pressure CVD method. Furthermore, on the surface thereof, the polycrystalline silicon layer 5 doped with impurities such as phosphorus is formed, for example, using the low pressure CVD method. The insulating film 11a such as an oxide film is formed on the surface thereof using the low pressure CVD method. Thereafter, the insulating film 11a and the polycrystalline silicon layer 5 are patterned to a predetermined configuration using the photolithography method and the etching method. As a result, the gate electrode 5 of the access transistor 15 is formed. Then, phosphorus (P), for example, is implanted into the single crystalline silicon layer 21 with the implantation energy 50 keV, and the dose of the order of $5\times10^{12}-1\times10^{15}/cm^2$ using the gate electrode covered with the insulating film 11a as a mask to form the n-type impurity regions 7a, 7b of a low concentration.

Figure 8:
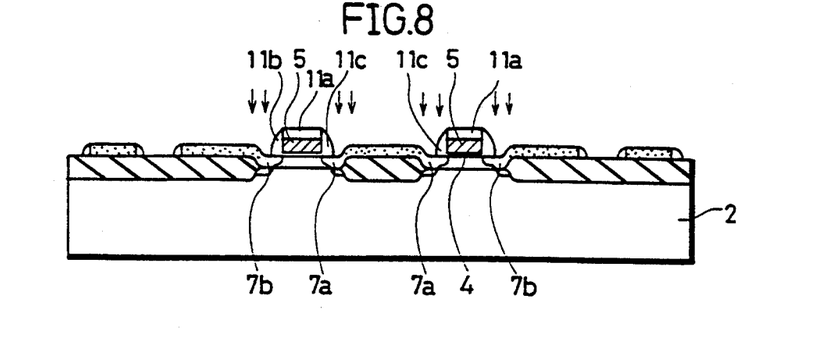

Referring to FIG. 8, an insulating film such as an oxide film is formed over the surface of the substrate 5 using, for example, the low pressure CVD method and then this insulating film is removed by anisotropic etching. This etching process causes the sidewalls 11b, 11c of the insulating film to be formed on the sidewalls of the gate electrode 5. Furthermore, for example, arsenic (As) is implanted with the implantation energy 50 keV and the dose of the order of $1\times10^{15}-1\times10^{16}/cm^2$ using the gate electrode covered with the sidewall insulating films 11b, 11c as a mask, and then a heat treatment is carried out. As a result, the n-type impurity regions 7a, 7b of a high concentration of the access transistor 15 are formed to complete the so-called LDD structure.

Figure 9:
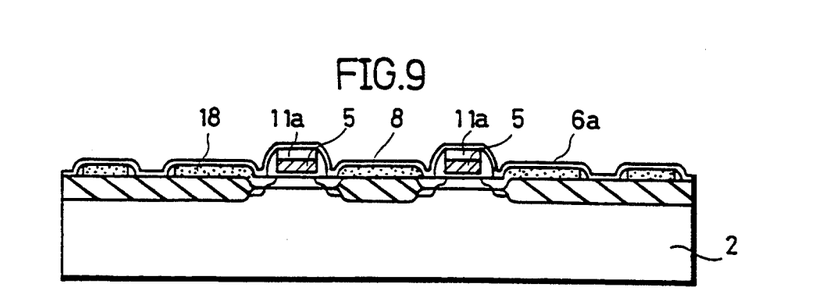

Referring to FIG. 9, a high melting point metal layer 6a such as titanium is formed over the entire surface of the semiconductor substrate 2, for example, using a sputtering method. Thereafter, a heat treatment at the temperature of 600°–700° C. is carried out using a lamp anneal method to cause the titanium layer in contact with the silicon layer to react.

Figure 10:
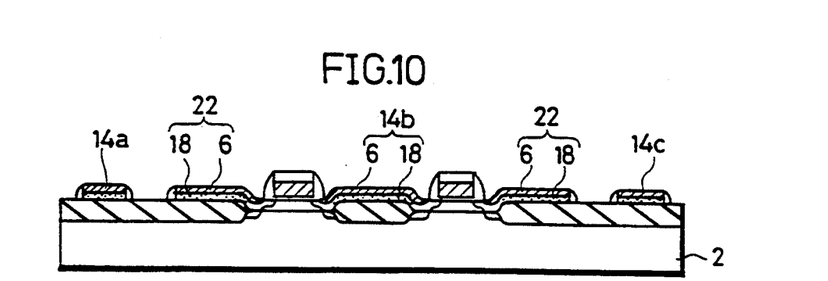

Referring to FIG. 10, as a result of the lamp anneal method, a titanium silicide layer 6 is formed on the surface of the patterned polycrystalline silicon layer 18 and the exposed surface of the single crystalline silicon layer 21. The titanium layer formed on the surface of the field oxide film 3 or other insulating films 11a, 11b, 11c and so on, which has not reacted, is removed using a solution such as $NH_4OH/H_2O_2$ and so on. Furthermore, a heat treatment at the temperature of 800° C. or above is carried out using the lamp anneal method.

Figure 11:
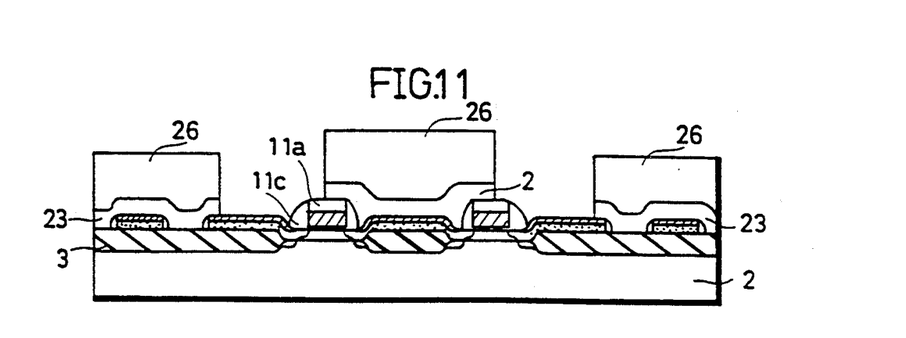

Referring to FIG. 11, an insulating film such as an oxide film is formed over the entire surface of the semiconductor substrate 2, for example, using the low pressure CVD method. Then, the insulating layer is patterned to a predetermined configuration using a resist mask 26 by the photolithography method and the etching method. As a result, a first insulating layer 23 and a second insulating layer 24 are formed. At this time, an insulating layer is further formed on the surface of the sidewall spacer 11b formed on one of the sidewalls of the gate electrode 5, so that the sidewall insulating films 11b, 11c having different thicknesses are formed on the sidewalls on both sides of the gate electrode 5.

Figure 12:
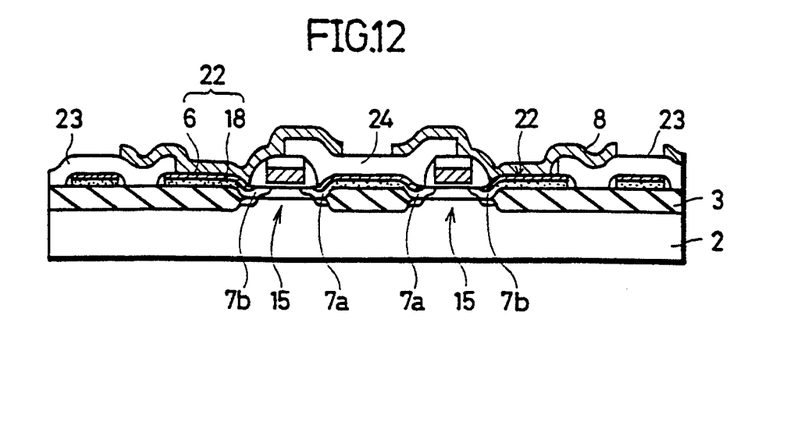

Referring to FIG. 12, after removing the resist mask 26, a polycrystalline silicon layer is formed over the entire surface, for example, using the low pressure CVD method and then patterned to a predetermined configuration, so that the lower electrode 8 of the capacitor 16 is formed. Above the field oxide film 3, the lower electrode 8 is connected to the titanium silicide layer 6 extending over the surface of the field oxide film 3.

Figure 13:
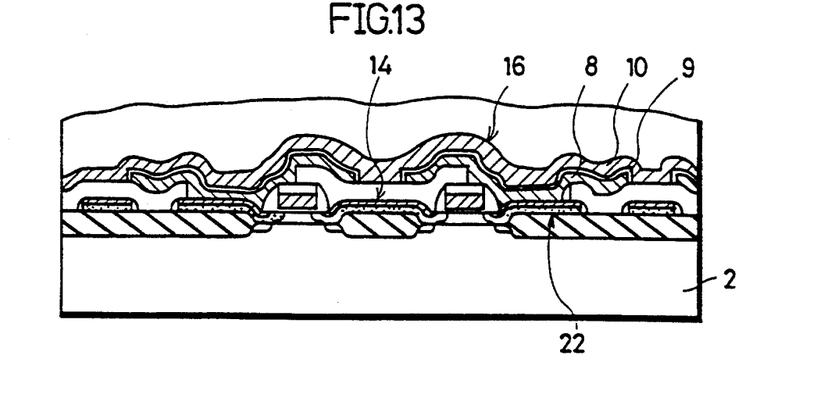

Referring to FIG. 13, a nitride film is formed over the entire surface, for example, using the low pressure CVD method. The whole semiconductor substrate 2 having the nitride film formed over it is heated in an atmosphere of oxidation to form an oxide film on the surface of the nitride film, so that a dielectric film 9 having a double layer structure of the nitride film and the oxide film is formed. Furthermore, a polycrystalline silicon layer is formed over the entire surface using, for example, the low pressure CVD method. Then, this polycrystalline silicon layer is patterned to a predetermined configuration, so that the upper electrode 10 of the capacitor is formed. Moreover, an interlayer insulating film 19 such as an oxide film is formed using the CVD method. Furthermore, an aperture portion 20 (refer to FIG. 3) reaching the gate electrode 5 is formed in the interlayer insulating layer 19. Then, a conductive layer such as polycrystalline silicon or aluminum or the like is formed inside this aperture portion 20 and on the surface of the interlayer insulating layer 19 using the low pressure CVD method and the sputtering method to be patterned to a predetermined configuration. As a result, word lines 17a-17c are formed. Then, the upper portion thereof is covered with an insulating layer 28.

The memory cells are thus completed in accordance with the processes stated above.

Figure 14:
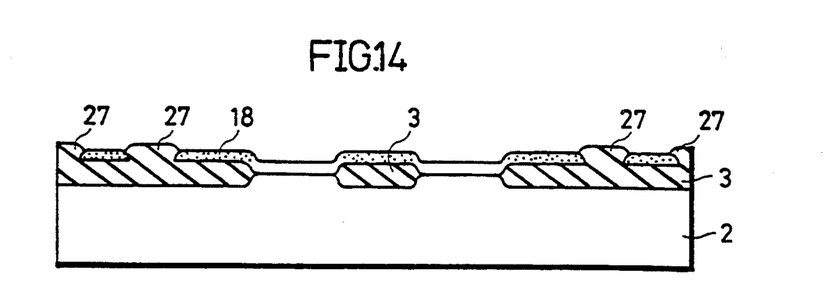
FIG. 14 is a cross sectional view of the structure of a modified example in a manufacturing process of a memory cell.

A modified example of the above-mentioned manufacturing processes will now be described. FIG. 14 is a modified example of the process shown in FIG. 6. In the process of FIG. 6, the sidewall 25 of the insulating film is formed on the sidewall of the patterned polycrystalline silicon layer 18 using anisotropic etching. In contrast with this, in FIG. 13, an insulating film 27 is formed between the patterned polycrystalline silicon layers 18 using a selective oxidation method.

While the description has been made of the method in which the polycrystalline silicon layer is changed to be amorphous by the ion implantation method in the above-mentioned embodiment, there may be employed a method in which an amorphous silicon layer is directly formed using the low pressure CVD method. Additionally, a material for the gate electrode is not limited to the polycrystalline silicon doped with phosphorus and may comprises layered films of high melting point metal silicide and polycrystalline silicon, a high melting point metal silicide film or a high melting point film.

Furthermore, the titanium silicide film 6 formed on the surface of the polycrystalline silicon layer 18 is not particularly limited to titanium, and silicide of other metal having a high melting point may be used. A high melting point metal silicide film may be formed using the selective CVD method and so on in a self-aligning manner.

In a DRAM according to the present invention, an access transistor is formed in a single crystalline silicon layer on a silicon substrate and a polycrystalline silicon layer extending to this single crystalline silicon layer extending to this single crystalline silicon layer is structured as a bit line, so that the contact region of the bit line is reduced and a miniaturized structure of the access transistor is realized.

In a DRAM according to the present invention, an access transistor is formed in a single crystalline silicon layer on a silicon substrate and a conductive layer extending to this single crystalline silicon layer is extended over an element isolation and insulation film. Then, on the surface thereof, there is placed a contact portion with a capacitor, so that a semiconductor memory device having a miniaturized access transistor can be implemented.

In accordance with a manufacturing method of a DRAM of the present invention, it is possible to easily manufacture a DRAM with an access transistor having the above-mentioned miniaturized structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM with memory cells each having one transistor and one capacitor, comprising:
    a silicon substrate of a first conductivity type having a main surface;
    a single crystalline silicon layer having an upper surface and a lower surface, said lower surface being in contact with the main surface of said silicon substrate, said single crystalline silicon layer being an epitaxial single crystal layer grown in contact with the main surface of the silicon substrate;
    a transistor having first and second impurity regions of a second conductivity type spaced apart from each other on the upper surface of said single crystalline silicon layer, a gate insulating film on the surface of said single crystalline silicon layer, and a gate electrode on the gate insulating film between the first and second impurity regions;
    a capacitor having a first electrode layer connected to said first impurity region of said transistor, a dielectric layer formed on the surface of said first electrode layer and a second electrode layer formed on the surface of said dielectric layer;
    a first conductive layer in contact with said gate electrode; and
    a bit line comprising a second conductive layer of polycrystalline silicon formed as a common layer as said single crystalline silicon layer and being in contact with said second impurity region of said transistor.

2. The DRAM according to claim 1, further comprising an isolation region formed on the main surface of said silicon substrate,
    wherein said first conductive layer is a word line, and said bit line has a portion lying on a surface of said isolation region.

3. The DRAM according to claim 2, further comprising a third conductive layer including a polycrystalline silicon layer formed as a common layer as said single crystalline silicon layer and being in contact with said second impurity region of said transistor and formed over said isolation region,
    wherein said first electrode layer of said capacitor is connected to said third conductive layer above said isolation region.

4. The DRAM according to claim 1, wherein said capacitor extends over said bit line with an interlayer insulating layer interposed therebetween.

5. The DRAM according to claim 2, wherein said word line is formed, above said bit line, extending in the direction perpendicular to said bit line, and is connected to said gate electrode through an aperture formed in the interlayer insulating film formed between said gate electrode of said transistor and said word line.

6. The DRAM according to claim 1, wherein said bit line further comprises a high melting point metal silicide layer on the surface of said polycrystalline silicon layer.

7. The DRAM according to claim 3, wherein said third conductive layer includes a high melting point metal silicide layer on the surface of said polycrystalline silicon layer, and
    said first electrode layer of said capacitor is connected to said high melting point metal silicide layer.

* * * * *